United States Patent
Horaguchi et al.

(10) Patent No.: US 10,420,262 B2
(45) Date of Patent: Sep. 17, 2019

(54) FEEDER MANAGEMENT DEVICE

(71) Applicant: FUJI CORPORATION, Chiryu-shi (JP)

(72) Inventors: Kazuhito Horaguchi, Anjo (JP); Jo Ikeyama, Nagoya (JP); Yuki Fujimura, Komaki (JP); Koushi Kuno, Ama (JP)

(73) Assignee: FUJI CORPORATION, Chiryu-shi (JP)

(*) Notice: Subject to any disclaimer, the term of this patent is extended or adjusted under 35 U.S.C. 154(b) by 135 days.

(21) Appl. No.: 15/569,658

(22) PCT Filed: Apr. 27, 2015

(86) PCT No.: PCT/JP2015/062688
§ 371 (c)(1),
(2) Date: Oct. 26, 2017

(87) PCT Pub. No.: WO2016/174712
PCT Pub. Date: Nov. 3, 2016

(65) Prior Publication Data
US 2018/0116079 A1 Apr. 26, 2018

(51) Int. Cl.
*H05K 13/02* (2006.01)
*G05B 19/418* (2006.01)
(Continued)

(52) U.S. Cl.
CPC ....... *H05K 13/02* (2013.01); *G05B 19/41865* (2013.01); *H05K 13/0417* (2013.01);
(Continued)

(58) Field of Classification Search
None
See application file for complete search history.

(56) References Cited

U.S. PATENT DOCUMENTS 5,371,940 A 12/1994 Suzuki et al.
2009/0126189 A1* 5/2009 Okada ................ H05K 13/0417
29/832
(Continued)

FOREIGN PATENT DOCUMENTS

JP 2009-295618 A 12/2009
JP 2011-77096 A 4/2011

OTHER PUBLICATIONS

Extended European Search Report dated Mar. 21, 2018 in Patent Application No. 15890696.6.
(Continued)

*Primary Examiner* — Ryan A Jarrett
(74) *Attorney, Agent, or Firm* — Oblon, McClelland, Maier & Neustadt, L.L.P.

(57) ABSTRACT

Provided is a feeder management device that appropriately controls editing of management information related to feeders so as to prevent electronic components of an incorrect type being supplied. The feeder management device includes: a data management section including management data in which a component type of an electronic component loaded on each of the feeders is linked to an identification code that specifies each of the multiple feeders; and an editing control section configured to determine whether editing is allowable based on a loading state of the electronic component on the feeder in a case in which editing of the management information is attempted to be performed in accordance with a change to the component type linked to the identification code of the feeder.

8 Claims, 4 Drawing Sheets

(51) Int. Cl.
*H05K 13/04* (2006.01)
*H05K 13/08* (2006.01)

(52) U.S. Cl.
CPC . *H05K 13/086* (2018.08); *G05B 2219/40543* (2013.01); *G05B 2219/45031* (2013.01)

(56) References Cited

U.S. PATENT DOCUMENTS

2011/0072654 A1 3/2011 Oyama et al.
2017/0322548 A1* 11/2017 Ohashi ................ G05B 19/418

OTHER PUBLICATIONS

International Search Report dated Aug. 4, 2015, in PCT/JP2015/062688 filed Apr. 27, 2015.

* cited by examiner

Feeder management information M1

| Feeder ID | Feeder type | Component type | Loading state | |
|---|---|---|---|---|
| | | | Tape quantity | Removal information |
| A001 | Auto Loading | a-1 | 1 | No processing |
| A002 | Auto Loading | b-1 | 2 | Processing performed |
| A003 | Splicing | a-2 | 0 | No processing |
| ⋮ | ⋮ | ⋮ | ⋮ | ⋮ |

FEEDER MANAGEMENT DEVICE

TECHNICAL FIELD

The present application relates to a management device for managing feeders used at a component mounter.

BACKGROUND ART

Component mounters are equipped with multiple tape type feeders such as those disclosed in patent literature 1 and bulk type feeders such as those disclosed in patent literature 2. Each of the multiple feeders is linked to the component type of the electronic component loaded on the feeder, and management is performed by a management device such as a host computer. The management device, for example, when mounting processing is being performed by the component mounter, guides an operator about which component mounter to attach a feeder to and to perform electronic component replenishment. Note that, a management device, in a case in which the component type of the electronic components loaded on a feeder is changed, updates management information linking the feeder to the component type based on information entered by an operator.

CITATION LIST

Patent Literature

Patent Literature 1: JP-A-2011-77096
Patent Literature 2: JP-A-2009-295618

SUMMARY

Technical Problem

Electronic components are respectively set on different feeders, with a tape reel being set on a tape type feeder and a component storage case being set on a bulk type feeder. However, when exchanging a tape reel or a component storage case, electronic components may remain on the feeder main body prior to exchange. Therefore, when management information of a feeder is updated in a state with electronic components remaining on the feeder, there is a worry that electronic components of a different type to the component type stored in the management information may be supplied.

The present disclosure takes account of such problems, and an object thereof is to provide a feeder management device that appropriately controls editing of management information related to feeders so as to prevent electronic components of an incorrect type being supplied.

Solution to Problem

The feeder management device according to the present disclosure manages feeders used on a component supply device of a component mounter. The feeder management device includes: a data management section including management data in which a component type of an electronic component loaded on each of the feeders is linked to an identification code that specifies each of the multiple feeders; and an editing control section configured to determine whether editing is allowable based on a loading state of the electronic component on the feeder in a case in which editing of the management information is attempted to be performed in accordance with a change to the component type linked to the identification code of the feeder.

Advantageous Effects

With the present disclosure, an editing request with respect to the management information related to the feeder is determined to be allowable or not according to the loading state of the electronic components on the feeder. By this, because it is possible to allow or disallow an editing request with respect to management information related to the feeder in a case in which electronic components remain on the feeder, it is possible to prevent the component type in the management information from being different to the component type of the electronic components actually loaded. In this manner, the management device appropriately controls editing of management information so as to prevent electronic components of an incorrect type being supplied.

DESCRIPTION OF EMBODIMENTS

Hereinafter, an embodiment of the present disclosure of a feeder management device is described with reference to the drawings. In the embodiment, a configuration in which a feeder management device is incorporated into a component mounter that mounts electronic components on a circuit board is given as an example. The component mounter configures a production line that manufactures circuit board products such as integrated circuits.

Embodiment
Configuration of Production Line 1

Figure 1:
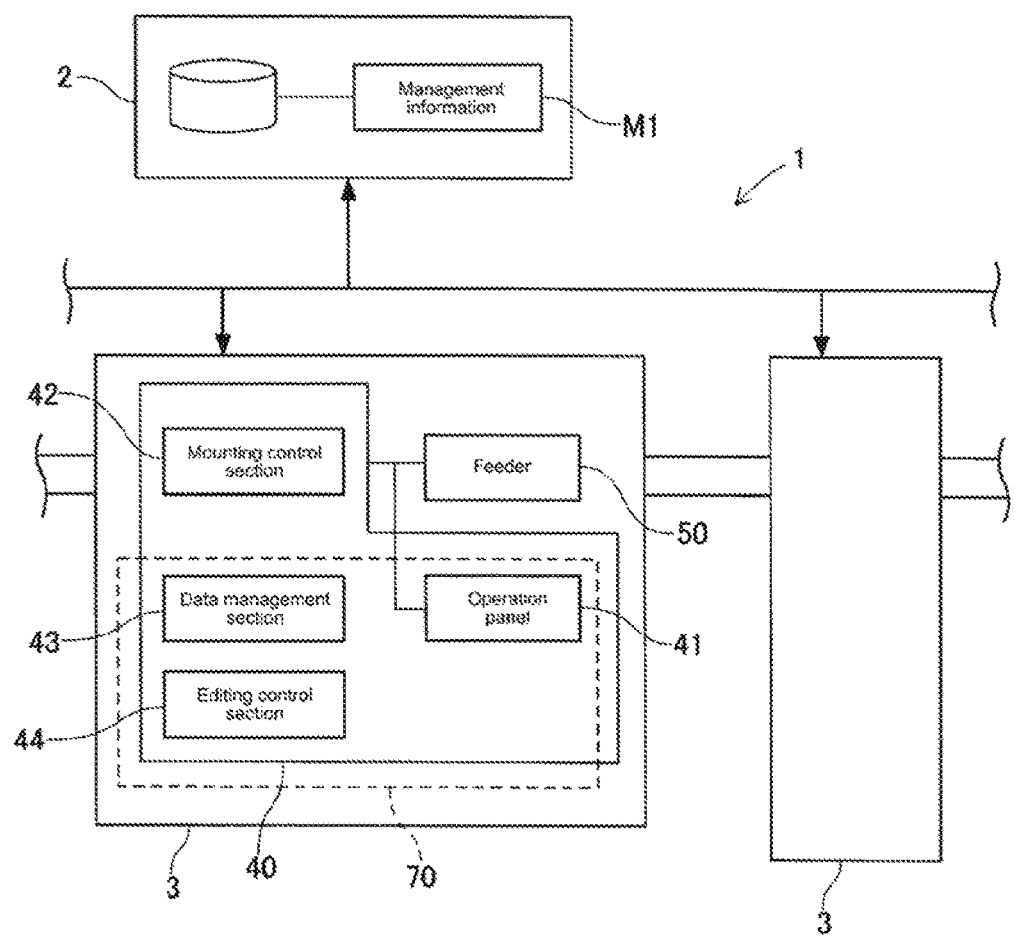
FIG. 1 is a block diagram showing a portion of a production line of an embodiment.

As shown in FIG. 1, production line 1 is configured from multiple items of production equipment connected via a network such that communication is possible with host computer 2. In addition to component mounter 3, this production equipment includes items such as a screen printer, a mounting inspection machine, and a reflow oven. The production equipment including component mounter 3 is configured such that various data can be entered to host computer 2 via a network.

Host computer 2 monitors the operating state of production line 1 and controls production equipment including component mounter 3. Host computer 2 includes a storage device configured of a hard disk, a flash memory or the like. Host computer 2 stores various data for controlling component mounter 3.

Specifically, host computer 2 stores a production plan including the type and quantity of circuit board product to be produced, a control program for controlling component mounters 3, management information M1 used for managing multiple feeders 50, and the like. Host computer 2, when performing production processing for each item of production equipment, sends various data such as a control program to each item of production equipment as appropriate.

Configuration of Component Mounter 3

Figures 2, 3:
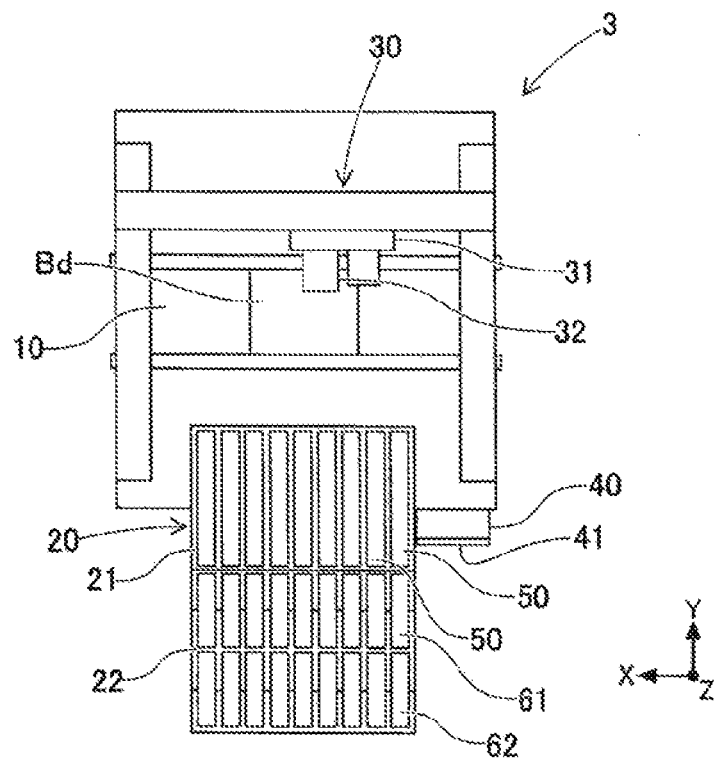
FIG. 2 is a plan view showing an entire component mounter that configures the production line of FIG. 1.
FIG. 3 shows feeder management information.

As shown in FIG. 2, multiple component mounters 3 that configure production line 1 are provided with board conveyance device 10, component supply device 20, component transfer device 30, and control device 40. In the descriptions below, the horizontal width direction of component mounter 3 (left-right direction in FIG. 2) is the X-axis direction, the horizontal lengthwise direction of component mounter 3 (up-down direction in FIG. 2) is the Y-axis direction, and the direction perpendicular to the X axis and Y axis (perpendicular to the page in FIG. 2) is the Z-axis direction.

Board conveyance device 10 is configured from a belt conveyor or the like and consecutively conveys boards Bd in a conveyance direction. Board conveyance device 10 positions board Bd at a specified position inside component mounter 3. Then, after mounting processing has been performed by component mounter 3, board conveyance device 10 unloads board Bd from component mounter 3.

Component supply device 20 supplies electronic components that are mounted on board Bd. Component supply device 20 includes multiple slots 21 and multiple reel holding sections 22 arranged lined up in the X-axis direction. Feeders 50 are removably set in each of the multiple slots 21. Component supply device 20 supplies electronic components to pickup section Nt (refer to FIG. 4) positioned at the leading end of feeder 50 (the upper side in FIG. 2) by feeder 50 feeding carrier tape 80. The detailed configuration of feeder 50 is described later.

Reel holding section 22 exchangeably holds a first reel 61 and a second reel 62 around which carrier tape 80 is wound. First reel 61 and second reel 62 are arranged lined up in the Y direction with respect to each feeder 50. That is, reel holding section 22 is configured such that carrier tape 80 is able to be supplied to one feeder 50 from first reel 61 and second reel 62.

Component transfer device 30 is configured to move in the X-axis direction and the Y-axis direction. Component transfer device 30 is arranged from the rear side in the lengthwise direction of component mounter 3 (the upper side in FIG. 2) to above component supply device 20 at the front of component mounter 3.

Component transfer device 30 is provided with head driving device 31 and mounting head 32. Head driving device 31 is configured to move a moving body in the XY-axis directions using a linear motion mechanism. Mounting head 32 is removably provided on the moving body of head driving device 31.

Also, multiple suction nozzles, which are not shown, are removably provided on mounting head 32. Mounting head 32 supports each suction nozzle so as to be rotatable around an R axis parallel to the Z axis and able to be raised/lowered. The height position and angle of each suction nozzle with respect to mounting head 32 and the state of supply of negative pressure to each suction nozzle is controlled. Each suction nozzle, by being supplied with negative pressure, picks up and holds an electronic component at pickup section Nt of feeder 50.

Configuration of Control Device 40

Control device 40 is configured mainly from a CPU, various types of memory, and control circuits, and controls electronic component mounting processing. As shown in FIG. 1, control device 40 includes operation panel 41, mounting control section 42, data management section 43, and editing control section 44. Control panel 41 displays various data of control device 40. Editing of the various displayed data is performed via control panel 41.

Mounting control section 42 controls the position of mounting head 32 of component transfer device 30 and operation of the pickup and mounting mechanism. In detail, mounting control section 42 performs mounting processing based on information outputted from various sensors provided on component mounter 3, and a control program obtained from host computer 2. By this, the position and rotation angle of suction nozzle provided on mounting head 32 is controlled.

Data management section 43 acquires and stores various types of data used in the management of multiple feeders 50. The above various data includes management information M1 acquired from host computer 2. As shown in FIG. 3, the above management information M1 links the feeder type, the component type of the electronic component loaded on feeder 50, and the loading state of the electronic component to a feeder ID (identification code) that identifies each of the multiple feeders.

Also, data management section 43, in a case in which editing of management information M1 is performed via operation panel 41, acquires and stores the entered information related to the editing. "Editing" of management information M1 includes registering a link between a new component type and a feeder 50, or changing or updating a component type already linked to a feeder 50 to a different component type. Further, data management section 43 communicates with the feeder 50 set in a slot 21 of component supply device 20, and acquires and stores each type of information, including a state of feeder 50.

Editing control section 44 controls editing of management information M1 performed via operation panel 41. Editing control section 44, in a case in which editing of management information M1 is attempted to be performed in accordance with a change to the component type linked to the feeder ID of a feeder 50, determines whether editing is allowed based on the loading state of electronic components on the feeder 50. Details of editing control of management information M1 are described later.

Configuration of Carrier Tape 80

Figure 4:
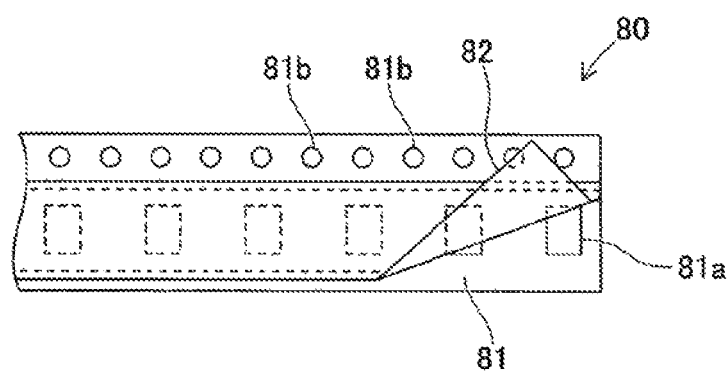
FIG. 4 is a plan view of a portion of carrier tape.

As described above, carrier tape 80 is wound around first reel 61 and second reel 62 held in reel holding section 22. Carrier tape 80 stores many components, such as electronic components, arranged in a line. As shown in FIG. 4, carrier tape 80 includes base tape 81 and cover tape 82.

Base tape 81 is formed of a flexible material such as paper or resin. Base tape 81 is provided with component storage sections 81a formed at a center section in the width direction (up-down direction in FIG. 4). Component storage sections 81a are a recess with a bottom. Component storage sections 81a are formed at regular intervals in the conveyance direction (lengthwise direction, left-right direction in FIG. 4) of base tape 81. One component is stored in each of the component storage sections 81a.

Also, base tape 81 includes indexing holes 81b formed at an edge section in the width direction of base tape 81. Indexing holes 81b are formed at regular intervals in the conveyance direction of base tape 81. Indexing holes 81b are formed so as to pierce through carrier tape 80 in the up-down direction (the thickness direction of carrier tape 80). In the present embodiment, the interval between respective indexing holes 81b is set to be smaller than the interval between respective component storage sections 81a.

Cover tape 82 is formed from a thin polymer film. Both sides of cover tape 82 in the width direction are attached to the upper surface of base tape 81. By this, cover tape 82 covers the openings of component storage sections 81a. With carrier tape with this kind of configuration, components stored in component storage sections 81a of base tape 81 are prevented from falling out.

Configuration of Feeder 50

Feeder 50 is set in a slot 21 of component supply device 20, and carrier tape 80 is supplied from first reel 61 and second reel 62 held on reel holding section 22. Feeder 50 supplies components by feeding carrier tape 80 inserted from insertion section Ni such that components are able to be removed from pickup section Nt. In this manner, feeder 50, in the present embodiment, is a tape type feeder onto which carrier tape 80 is loaded, with electronic components being stored in carrier tape 80.

Also, feeder 50 is configured to be able to supply components continuously without connecting (splicing) a replenishment carrier tape to a carrier tape 80 in use. In detail, feeder 50 holds replenishment carrier tape 80 (hereinafter also referred to as "replenishment tape T2") in a standby state on top of in-use carrier tape 80 (hereinafter also referred to as "conveyance tape T1"). Then, when conveyance tape T1 reaches the end, indexing of replenishment tape T2 is started such that replenishment tape T2 follows the trailing end of conveyance tape T1. Replenishment tape T2 for which feeding has started then becomes in-use carrier tape 80 (conveyance tape T1).

Figure 5:
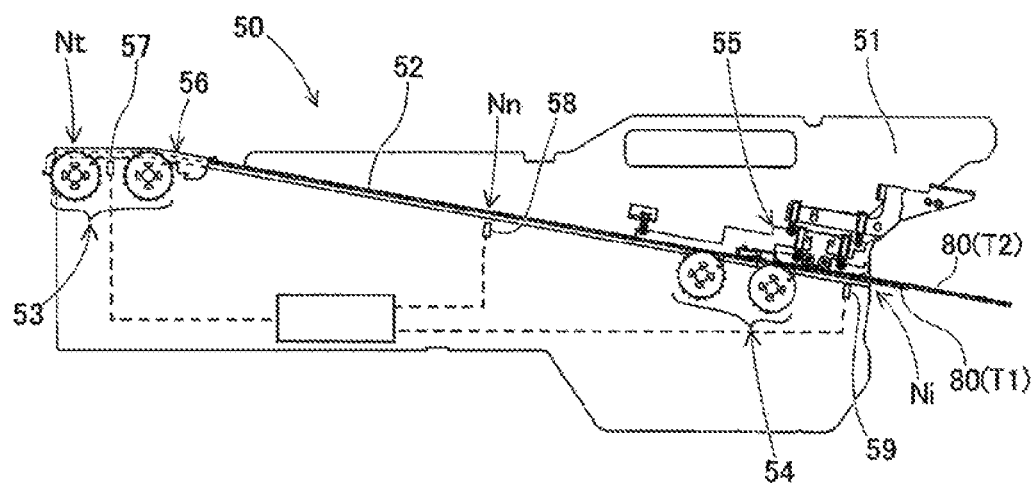
FIG. 5 shows an entire feeder.

As shown in FIG. 5, feeder 50 includes case 51, rail 52, first driving device 53, second driving device 54, tape feeding unit 55, tape peeling unit 56, and multiple detection sensors 57 to 59. Case 51 is formed in a flat box shape, and is fixed in position by being inserted into a slot 21 of component supply device 20. Rail 52 is provided from insertion section Ni at the rear section of case 51 to pickup section Nt at the front section of case 51. The upper surface of rail 52 configures a portion of the conveyance path of carrier tape 80.

First driving device 53 includes a pair of sprockets provided below rail 52 at pickup section Nt. Second driving device 54 includes a pair of sprockets provided below the rail at insertion section Ni. Each sprocket is arranged such that a portion protrudes to the upper surface side of rail 52 from a window formed in rail 52, so as to be engageable with indexing holes 81b of carrier tape 80.

First driving device 53 and second driving device 54 simultaneously rotate each sprocket via a stepping motor, which is not shown. First driving device 53 configured in such a manner configures a mechanism that drives carrier tape 80 on rail 52 to pickup section Nt. Further, second driving 54 configures a feeding mechanism that feeds a leading end of carrier tape 80 from the insertion section Ni to the pickup section Nt when the leading end of the carrier tape 80 has been inserted into insertion section Ni.

Tape feeding unit 55 is arranged above rail 52 at which second drive device 54 is positioned, in the conveyance direction of carrier tape 80. Tape feeding unit 55 pushes carrier tape 80 positioned within rail 52 against rail 52. By this, tape feeding unit 55 assists the sprockets of second driving device sprocket 34 to engage with indexing holes 81b of carrier tape 80. Also, tape feeding unit 55 has a function to hold replenishment tape T2 inserted in advance with respect to in-use conveyance tape T1.

Tape peeling unit 56 is arranged above rail 52 at which the sprockets of first driving device 53 are positioned in the conveyance direction of carrier tape 80.

Tape peeling unit 56 peels cover tape 82 of the fed carrier tape 80 from base tape 81 such that components are exposed at pickup section Nt. Also, tape peeling unit 56 guides cover tape 82 peeled from base tape 81 to a reject duct.

Multiple detection sensors 57 to 59 are for detecting the presence of carrier tape 80 at three different locations on rail 52 (pickup section Nt, intermediate section Nn, and insertion section Ni). In the present embodiment, first detection sensor 57 arranged at pickup section Nt detects the presence of carrier tape 80 at pickup section Nt by contacting carrier tape 80 on rail 52. Second detection sensor 58 arranged at an intermediate section between pickup section Nt and insertion section Ni detects the presence of carrier tape 80 at intermediate section Nn by contacting carrier tape 80 on rail 52.

Further, third detection sensor 59 arranged at insertion section Ni detects the presence of carrier tape 80 (conveyance tape T1) and replenishment carrier tape 80 (replenishment tape T2) at insertion section Ni by the operating state of tape feeding unit 55 (for example, the operating state of pushing carrier tape 80 against rail 52). That is, third detection sensor 69 detects the quantity (in the present embodiment, zero to two) of carrier tapes 80 loaded on feeder 50.

Feeder 50 with such a configuration, in a reset state, after the leading end of carrier tape 80 has been inserted into insertion section Ni, automatically feeds the leading end carrier tape 80 to pickup section Nt via intermediate section Nn by the driving of second driving device 54, thus loading carrier tape 80. Note that, a "reset state" of feeder 50 above refers to a state in which carrier tape 80 is not loaded on feeder 50, that is, a state in which carrier tape 80 is not present at any of the above positions on rail 52.

Thus, feeder 50 of the present embodiment is an auto loading type feeder with a feeding mechanism (second driving device 54) at insertion section Ni. Further, the multiple detection sensors 57 to 59, when carrier tape 80 is fed, detect the carrier tape 80 sequentially, and output a detection result to control device 40 of component mounter 3 via a control section of feeder 50.

Feeder 50, in a state in which replenishment carrier tape 80 is not inserted, in a case in which the trailing end of in-use carrier tape 80 passes insertion section Ni, is configured to be able to feed carrier tape 80 up to pickup section Nt using first driving device 53. Here, feeder 50 is in a state in which detection sensors 57 to 59 can detect carrier tape 80 only at pickup section and intermediate section Nn, or only at pickup section Nt.

Note that, with a state of carrier tapes 80 as given above, feeder 50 is able to replenish an existing carrier tape 80 continuously with a different carrier tape 80. In detail, after the leading end of a different carrier tape has been inserted into insertion section Ni, feeder 50 drives second driving device 54 until the leading end of the different carrier tape 80 contacts the trailing end of the existing carrier tape 80. Subsequently, by simultaneously driving first driving device 53 and second driving device 54, feeder 50 is able to continuously supply electronic components.

Also, feeder 50 is able to perform removal processing of carrier tape 80 that is loaded. In detail, feeder 50 drives first driving device 53 and second driving device 54 in a direction opposite to that during supply of electronic components, thus feeding carrier tape 80 so that it returns to the insertion section Ni side from the pickup section Nt side, thereby removing carrier tape 80. In addition, feeder 50, after the trailing end of carrier tape 80 has passed insertion section Ni, feeds for a length equal to or greater than a path from insertion section Ni to pickup section Nt such that carrier tape 80 is removed.

Editing Control of Management Information M1

Figure 6:
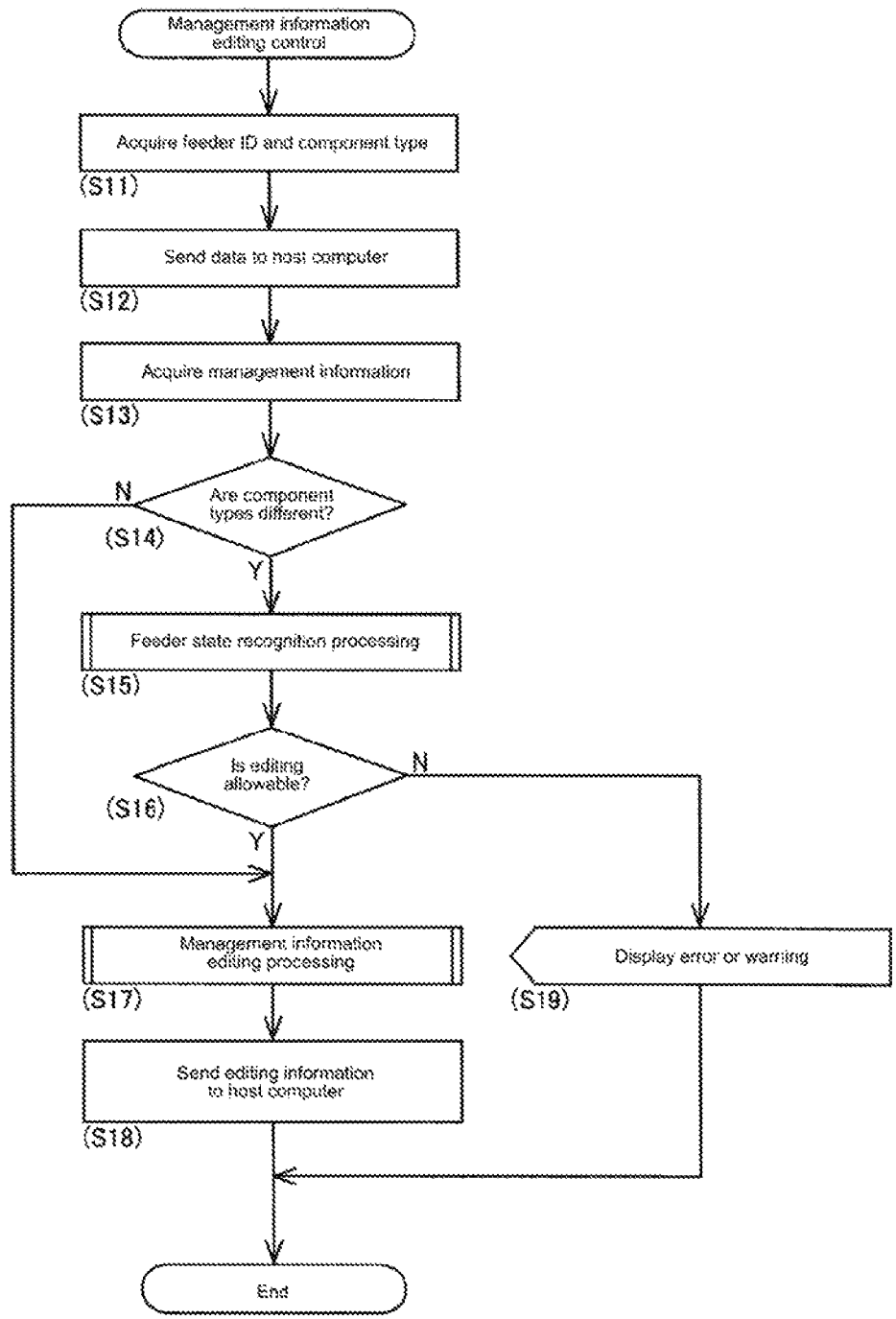
FIG. 6 is a flowchart showing editing control of management information.

In the above component mounter 3, operation panel 41, data management section 43, and editing control section 44 of control device 40 configure management device 70 that manages feeders 50 (refer to FIG. 1). Described below is editing control of management information M1 by management device 70. Management device 70, when editing of management information M1 is attempted to be performed by an operator via operation panel 41, performs editing control of management information M1 as shown in FIG. 6.

Here, an editing request of management information M1 by an operator is a request to register or change management information M1 of a carrier tape 80 loaded with electronic components of a specified component type with respect to a feeder 50 set on slot 21 of component supply device 20 such that communication is possible. Tape management section 43 acquires (step 11 [hereinafter "step" is written "S"]) the entered component type and feeder ID (identification code) of the feeder 50 for which the operator is performing editing via operation panel 41.

Here, various methods may be used by data management section 43 to acquire the component type and feeder ID. For example, an identification code affixed to feeder 50 may be read by a code reader (not shown) of management device 70 so as to acquire a feeder ID recorded in the identification code. Similarly, an identification code affixed to a reel (first reel 61, second reel 62) around which carrier tape 80 is wound may be read by a code reader of management device 70 so as to acquire the component type of the electronic component stored in the carrier tape 80 wound around the reel. Any one or combination of barcode, 2D code, character string, pattern, or shading may be used as the above identification code.

Also, data management section 43, in a case in which a particular feeder 50 is specified by an operator entering a specific slot number for the slot 21, the feeder ID stored in the control section of the feeder 50 may be obtained via communication with the feeder 50. In addition to the above, data management section 43 may, for example, use a feeder ID or component type entered directly by an operator via the operation panel as the feeder ID and component type for the feeder 50 for which editing is being performed.

Next, data management section 43 sends data with information required for the feeder ID to host computer 2 (S12). Included in the required information sent to host computer 2 as appropriate are, for example, the type of component mounter 3, a send request of management information M1, and an operating state of feeder 50. By this, host computer 2 selects at least information corresponding to a feeder ID for which there was a request from management information M1 of feeders 50 which can be used by any of the multiple component mounters 3 (this information corresponds to the information of a single row in FIG. 3).

Host computer 2 sends management information M1 for which a send request of the feeder ID and management information M1 was performed to component mounter 3. Data management section 43 acquires management information M1 sent from host computer 2 (S13). Here, in a case in which editing is performed on management information M1, management information M1 is acquired from host computer 2. With respect to this, control device 40 may be configured to acquire management information M1 in advance at various timings.

That is, data management section 43, for example, may be configured to acquire in advance management information M1 related to all feeders 50 set in slots 21 when power is turned on to component mounter 3. Alternatively, data management section 43 may be configured to acquire a portion of management information M1 corresponding to a given feeder 50 when the feeder 50 is set on slot 21 and it is detected that communication is possible.

Editing control section 44 determines whether the component type corresponding to the feeder ID in management information M1 is different to the component type acquired in S11 (S14). If the component types match (S14: N), there is no change in the component type, and editing of management information M1 is allowed. Also, in a case in which the component type is not yet registered in management information M1 (S14: N), because the component type is to be newly registered, editing of management information M1 is allowed, and editing processing of management information M1 is performed (S17).

On the other hand, in a case in which the component types are different (S14: Y), if editing of management information M1 is attempted to be performed in accordance with a change to the component type linked to the feeder ID of a feeder 50, editing control section 44 determines whether editing is allowed based on the loading state of electronic components on feeder 50. Thus, editing control section 44 performs recognition processing of the loading state (S15) of the feeder 50. In detail, editing control section 44, as a loading state of feeder 50, acquires the current tape quantity loaded on the feeder 50, removal information recording whether removal processing of removing carrier tape 80 from the feeder 50 has been performed, or the like from data management section 43.

Here, the "current tape quantity" of the feeder 50 is calculated based on detection results of the multiple detection sensors 57 to 59 of the feeder 50, and in the present embodiment is a quantity from zero to two. Also, editing control section 44 recognizes whether the trailing end of loaded carrier tape 80 is one of outside of feeder 50 (at the reel holding section 22 side), from insertion section Ni to intermediate section Nn, or from intermediate section Nn to pickup section Nt, as a loading state.

Further, "removal information" of feeder 50, indicates whether, via registration by an operator or by a regular operation, the feeder 50 is in a reset state in which no carrier tape 80 exists inside feeder 50. Data management section 43 recognizes and records that removal processing has been performed based on, for example, a detection result of detection sensors 57 to 59, or a driving history of first driving device 53 and second driving device 54.

Continuing, editing control section 44 determines whether to allow editing of management information M1 (S16) based on the loading state of feeder 50 recognized in S15. Here, editing control section 44 determines whether to allow editing in accordance with predetermined judgment criteria. This judgment criteria may be, for example, judgment criteria (A) or (B) as given below. A condition for judgment criteria (A) is that feeder 50 is currently in a reset state. That is, editing control section 44 allows editing of management information M1 in a case in which the quantity of carrier tapes 80 loaded on feeder 50 is zero.

Further, a condition of judgment criteria (B) is that the current carrier tape 80 has been loaded after removal processing has been performed. That is, in a case in which feeder 50 is not currently in a reset state, but it has been recognized that the current carrier tape 80 was loaded after a reset state was achieved, editing control section 44 considers that an operator has intentionally loaded an electronic component of a given component type, and allows editing of management information M1.

Editing control section 44, in a case of allowing editing of management information M1 (S16: Y), performs editing processing of management information M1 (S17). In detail, editing control section 44 links the component type acquired in S11 to the feeder ID of the feeder 50. Further, as required, editing control section 44 edits management information M1 such that the current tape quantity and removal information (no processing) is recorded as a loading state linked to the feeder ID.

Data management section 43 sends management information M1 edited by editing processing being performed by editing control section 44 (S17) to host computer 2 (S18). Note that, in a case in which judgment criteria (A) from above is set, after editing control of management information M1 is complete, carrier tape 80 storing electronic components of the corresponding component type is loaded.

On the other hand, in a case in which editing control section 44 does not allow editing of management information M1 (S16: N), management device 70 indicates an error or a warning to the operator that the editing request is not valid (S19). The indication of this error or the like, in a case in which the above judgment criteria (A) is set, for example, indicates to the operator that carrier tape 80 is present on feeder 50.

Also, in a case in which the above judgment criteria (B) is set, a warning is given that there is a danger that removal processing has not been performed and that the component type of the currently loaded electronic component does not match the component type which will be changed to by the editing. In this manner, management device 70 prompts an operator to perform removal processing of feeder 50, or to check whether there is a mistake in the entry of the component type attempting to be changed to. By this, a situation in which the component type in management information M1 is different to the component type of the loaded electronic components is prevented.

In a case in which management information M1 is appropriately edited by editing control as above, host computer 2 acquires and stores the edited management information M1. Then, host computer 2, based on the management information M1, for example, can issue guidance for the feeder 50 and component type of the electronic component to be loaded that are to be used for production of a specified circuit board product, and can issue guidance of the component mounter 3 in production line 1 to which the feeder 50 should be set.

Effects of Embodiment

Management device 70 of feeder 50 according to the present embodiment manages feeders 50 used on component supply device 20 of component mounter 3. Management device 70 of feeder 50 is provided with: data management section 43 including management data M1 in which a component type of an electronic component loaded on each of the feeders 50 is linked to an identification code (feeder ID) that specifies each of the multiple feeders 50; and editing control section 44 configured to determine whether editing is allowable based on a loading state of the electronic component on the feeder 50 in a case in which editing of the management information M1 is attempted to be performed in accordance with a change to the component type linked to the identification code of the feeder 50.

According to such a configuration, an editing request of management information M1 is judged to be allowable or not based on a loading state of electronic components on feeder 50 (S16). By this, in a case such as when electronic components remain in the feeder 50, the editing request of the management information M1 is rejected (S16: N). Thus, a situation is prevented in which editing causes the component type in management information M1 to be different to the component type of the loaded electronic components. In such a manner, management device 70 appropriately controls editing of management information M1 so as to prevent electronic components of an incorrect type being supplied.

Also, feeder 50 is a tape feeder configured to feed carrier tape 80 in which multiple of the electronic components are stored at a regular interval from an insertion section to pickup section Nt, such that the electronic components can be picked up at pickup section Nt.

Tape type feeder 50 requires carrier tape 80 to be fed along a path inside feeder 50. Therefore, there are cases in which carrier tape 80 remains inside feeder 50 in a state with the trailing end of carrier tape 80 passed insertion section Ni of feeder 50. In such a case, if an operator loads carrier tape storing electronic components of a different component type and edits management information M1 accordingly, the component type of management information M1 will be different to the component type of the electronic components actually loaded on the feeder 50 (electronic components stored in the remaining carrier tape 80). Thus, it is particularly effective to appropriately control editing of management information M1 for tape feeders.

Also, the tape feeder (feeder 50) includes a feeding mechanism (second driving device 54) that feeds a leading end of carrier tape 80 from insertion section Ni to pickup section Nt when the trailing end of carrier tape 80 has been inserted into insertion section Ni.

According to such a configuration, feeder 50 is an auto loading feeder including a feeding mechanism (second driving device 54) that is able to replenish an existing carrier tape 80 continuously with a different carrier tape 80. Therefore, in a case in which carrier tape 80 storing electronic components of a different component type is loaded, it is easy to overlook a remaining carrier tape 80, and if a replenishment carrier tape 80 is loaded and management information M1 edited accordingly, a difference will arise in the component types. Thus, it is particularly effective to appropriately control editing of management information M1 for auto loading type feeders 50.

Also, the tape feeder (feeder 50) includes detection sensor 57 capable of detecting the presence of carrier tape 80 at pickup section Nt. Editing control section 44 acquires a detection result of detection sensor 57 as a loading state, and determines whether to allow editing of management information M1 based on the loading state. According to such a configuration, editing control section 44 of management device 70 determines whether to allow editing of management information M1 after recognizing the presence or absence of carrier tape 80 at pickup section Nt based on a detection result of first detection sensor 57 of feeder 50. Accordingly, it is possible to reliably control editing of management information M1 taking into account the presence or absence of carrier tape 80 remaining in feeder 50 in a state in which the leading end of the carrier tape 80 has passed insertion section Ni.

Also, the loading state includes the quantity of carrier tapes 80 loaded on the tape feeder (feeder 50). In the present embodiment, the quantity of carrier tapes 80 loaded on feeder 50 varies from zero to two, including standby tape. By recognizing the quantity of carrier tapes 80 as the loading state in this manner, management device 70 can easily recognize the loading state at feeder 50. Accordingly, the load of editing control can be reduced while still reliably controlling editing of management information M1.

Also, editing control section 44 allows editing in a case in which the quantity of carrier tapes 80 loaded on the tape feeder (feeder 50) is zero. According to such a configuration (a configuration in which the above judgment criteria [A] is set), editing requests of management information M1 are allowed in a case of a reset state in which carrier tape 80 has been removed from feeder 50. Thus, a situation in which the component type in management information M1 is different to the component type of the loaded electronic components is reliably prevented.

Also, removal information that records whether removal processing of removing the carrier tape 80 from the tape feeder (feeder 50) has been performed is included in the loading state. According to such a configuration (a configuration in which the above judgment criteria [B] is set), editing requests of management information M1 are determined to be allowed or not based on removal information included in the loading state. In a case in which a feeder 50 is recognized as having been temporarily returned to a reset state according to the removal information, it can be considered that an operator has intentionally loaded an electronic component of a given component type. Thus, management device 70 allows editing of management information M1 in a case in which removal processing of carrier tape 80 was performed after management information M1 was last edited, and editing can be controlled efficiently.

Also, it is recorded in the removal information of the loading state that removal processing has been performed in a case in which, after the trailing end of carrier tape 80 has passed insertion section Ni of the tape feeder (feeder 50), feeding has been performed for a length equal to or greater than the path from insertion section Ni to pickup section Nt. According to such a configuration, in a case in which carrier tape 80 has been fed for a length equal to or greater than the path after the trailing end of carrier tape 80 has passed insertion section Ni, the trailing end of carrier tape 80 is in a state passed pickup section Nt. By recording this state in the removal information as removal processing of carrier tape 80 having been performed, it is possible to reliably determine whether to allow editing of management information M1 based on the loading state that includes the removal information.

Alternative Embodiment

Editing Control of Management Information M1

In the above embodiment, editing control section 44 considered that there was no change in the component tape in a case in which the registered component type (the component type corresponding to the feeder ID in management information M1) and the component type to be edited (the component type acquired in S11) match (that is, S14: N), and thus allowed editing of management information M1. The determination of S14 is performed such that recognition processing of the loading state (S15) can be omitted, thus simplifying editing control, in a case in which there is no change in the component type before and after editing. With respect to this, editing control section 44 may be configured to not perform determination of the whether there was a change in the component type before and after editing (S14).

Here, feeder 50, in an offline state such as a storage warehouse in which communication is not possible with host computer 2 or component mounter 3, there cases in which carrier tape 80 of a specific component type is loaded in advance as part of changeover of production of a circuit board product. In such a case, if a carrier tape 80 of a different component type remains on the feeder 50, there is a worry that the component type in management information M1 will be different to the component type supplied by the remaining component tape 80. Thus, editing control section 44, in an offline state in which communication is not possible with host computer 2 or component mounter 3, may be configured to allow loading of carrier tape 80 and editing of management information M1 in accordance with the loading.

In detail, editing control section 44 may, as above, not perform determination of whether the component type was changed before and after editing (S14). According to such a configuration, editing control section 44, in a case in which there is an editing request for management information M1, regardless of whether there was a change in the component type, may perform recognition processing of the loading state of offline feeder 50 (S15), and determine whether editing is allowed (S16) based on the processing result. Thus, editing of management information M1 is controlled even more reliably, and supplying an electronic component of the wrong component type is prevented.

In the above embodiment, editing control section 44 performs recognition processing of the loading state of feeder 50 (S15). Here, editing control section 44 acquires the current tape quantity or the like based on a detection result of the multiple detection sensors 57 to 59 from data management section 43, and recognizes that as the loading state of feeder 50. On the other hand, editing control section 44 may be configured to, during recognition processing of the loading state (S15), acquire a detection result from multiple detection sensors 57 to 59 at that time, and thus directly recognize the loading state. According to such a configuration, it is possible to perform editing control in accordance with the loading state of feeder 50 at the point in time in which editing of management information M1 was attempted.

Also, as a configuration for data management section 43 to record operation of first driving device 53, second driving device 54, tape feeding unit 55, and the like, during recognition processing of the loading state (S15), editing control section 44 may estimate the loading state of feeder 50 from the operation history recorded in data management section 43. According to such a configuration, for example, the manufacturing costs of feeder 50 are reduced due to a portion of the detection sensors not being required, or recognition of the loading state may be performed more reliably by combining the detection results of detection sensors 57 to 59.

Editing control section 44, in S16, determines whether editing of management information M1 is allowed in accordance with the set judgment criteria (A) or (B). On the other hand, editing control section 44 may be configured to determine whether editing is allowable by other set criteria. In detail, for example, in a case in which the trailing end of carrier tape 80 is positioned further to the reel holding section 22 side than insertion section Ni, editing control section 44 may allow editing of management information M1.

With auto loading type tape feeders, in a case in which carrier tape 80 is present with the trailing end of the carrier tape 80 being inside the feeder 50, it is especially necessary to restrict the editing of management information M1. On the other hand, if the trailing end of the carrier tape 80 is protruding to the reel holding section 22 side, it is easy for an operator to check visually, so it is possible to consider that intentionally loaded carrier tape 80 of a given component type.

Thus, editing control section 44, for example, may allow editing of management information M1 in a case in which the tape quantity at insertion section Ni is the same or greater than the tape quantity at pickup section Nt (that is, a state in which replenishment tape T2 is inserted). On the other hand, editing control section 44 may prohibit editing of management information M1 in a case in which the tape quantity at insertion section Ni is less than the tape quantity at pickup section Nt (that is, a state in which the trailing end has passed insertion section Ni). However, from the point of view of more reliably controlling editing of management information M1, it is preferable to have a configuration that uses judgment criteria (A) or (B) as given in the first embodiment.

Feeder 50

In the first embodiment, feeder 50 is an auto loading type tape feeder. However, feeder 50, as a mechanism for feeding carrier tape 80, may be configured without a feeding mechanism of second driving device 54. A feeder configured as such is a type of feeder for which carrier tape 80 is replenished each time a reset state occurs, or a splicing type feeder that connects carrier tapes 80 to each other.

Further, in addition to a tape feeder, feeder 50 may be a bulk feeder that employs a bulk method. A bulk feeder is loaded with electronic components by a component storage case being set. Editing control section 44 of management device 70, similar to a case in which a tape feeder is being managed, determines whether editing of management information M1 is allowable based on a loading state of the electronic components on the bulk feeder. In detail, for a feeder main body of a bulk feeder from which the component storage case has been removed, for example, a detection sensor may be arranged on a supply section that discharges components to the outside of the feeder, and editing control section 44 may recognize the loading state of the electronic components based on a detection result of the detection sensor.

According to such a configuration, because an editing request of management information M1 will be refused when there are electronic components remaining on the bulk feeder, it is possible to prevent the component type in management information M1 from being different to the component type of the electronic components actually loaded due to editing. Accordingly, management device 70 appropriately controls editing of management information M1 so as to prevent electronic components of an incorrect type being supplied.

Management Device 70

In the first embodiment, management device 70 is configured from operation panel 41, data management section 43, and editing control section 44, and is integrated in control device 40 of component mounter 3. However, management device 70 may be configured as an external device to component mounter 3. For example, the management device may be configured such that the data management section and editing control section are provided on host computer 2, and determination of whether editing is allowable may be performed at host computer 2 or component mounter 3.

Reference Signs List

3: component mounter;
  20: component supply device;
  40: control device;
    41: operation panel; 42: mounting control section; 43: data management section; 44: editing control section;

Reference Signs List

50: feeder;
  54: second driving device (feeding mechanism);
  57 to 59: detection sensors;
80: carrier tape;
Nt: pickup section; Nn: intermediate section; Ni: insertion section;
T1: conveyance tape; T2: replenishment tape; M1: management information

The invention claimed is:

1. A feeder management device for managing feeders used on a component supply device of a component mounter, the feeder management device comprising:
    a data management section including management data in which a component type of an electronic component loaded on each of the feeders is linked to an identification code that specifies each of the multiple feeders: and
    an editing control section configured to determine whether editing is allowable based on a loading state of the electronic component on the feeder in a case in which edit ng of the management information is attempted to be performed in accordance with a change to the component type linked to the identification code of the feeder.

2. The feeder management device according to claim 1, wherein
    the feeder is a tape feeder configured to feed carrier tape in which multiple of the electronic components are stored at a regular interval from an insertion section to a pickup section, such that the electronic components can be picked up at the pickup section.

3. The feeder management device according to claim 2, wherein
    the tape feeder includes a feeding mechanism configured to feed a leading end of the carrier tape from the insertion section to the pickup section when the leading end of the carrier tape is inserted into the insertion section.

4. The feeder management device according to claim 2, wherein
    the tape feeder includes a detection sensor configured to detect a presence of the carrier tape at the pickup section, and
    the editing control section acquires a detection result of the detection sensor as the loading state and determines whether editing of the management information is allowable based on the loading state.

5. The feeder management device according to claim 2, wherein
    a quantity of the carrier tapes loaded on the tape feeder is included in the loading state.

6. The feeder management device according to claim 5, wherein
    the editing control section allows the editing in a case in which the quantity of the carrier tapes loaded on the tape feeder is zero.

7. The feeder management device according to claim 2, wherein
    removal information that records whether removal processing of removing the carrier tape from the tape feeder has been performed is included in the loading state.

8. The feeder management device according to claim 7, wherein
the removal processing is recorded as having been performed in the removal information of the loading state in a case in which, after a trailing end of the carrier tape has passed the insertion section of the tape feeder, feeding is performed for a length equal to or greater than a path from the insertion section to the pickup section.

* * * * *